United States Patent
Boerstler et al.

(10) Patent No.: US 7,620,126 B2
(45) Date of Patent: *Nov. 17, 2009

(54) METHOD AND APPARATUS FOR DETECTING FREQUENCY LOCK IN A SYSTEM INCLUDING A FREQUENCY SYNTHESIZER

(75) Inventors: David William Boerstler, Round Rock, TX (US); Matthew E. Fernsler, Round Rock, TX (US); Eskinder Hailu, Austin, TX (US); Jieming Qi, Austin, TX (US); Mack Wayne Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 583 days.

This patent is subject to a terminal disclaimer.

(21) Appl. No.: 11/236,658

(22) Filed: Sep. 27, 2005

(65) Prior Publication Data

US 2007/0071154 A1    Mar. 29, 2007

(51) Int. Cl.
H03D 3/18    (2006.01)
(52) U.S. Cl. ........................................ 375/327
(58) Field of Classification Search ........... 375/215, 375/294, 327, 354, 357, 369, 372, 373, 374, 375/376; 370/395.62, 507, 503; 455/265, 455/180.3, 266; 702/89; 713/375, 400; 342/103
See application file for complete search history.

(56) References Cited

U.S. PATENT DOCUMENTS

| 5,294,894 | A  | 3/1994  | Gebara        |
|-----------|----|---------|---------------|
| 5,432,830 | A  | 7/1995  | Bonnot        |
| 5,680,076 | A  | 10/1997 | Kelkar et al. |
| 5,956,379 | A  | 9/1999  | Tarleton      |
| 5,969,576 | A  | 10/1999 | Trodden       |
| 6,133,769 | A  | 10/2000 | Fontana       |
| 6,320,469 | B1 | 11/2001 | Friedberg et al. |
| 7,190,201 | B2 * | 3/2007 | Haerle et al. ............ 327/158 |
| 2005/0242852 | A1 * | 11/2005 | Parker et al. ............ 327/156 |

FOREIGN PATENT DOCUMENTS

EP    0 550 360 A1    7/1993

OTHER PUBLICATIONS

Cadence Design Systems, "Constraining the Design", downloaded from lore-consulting.com May 18, 2005.
Morris Jones, "ASIC Design Clocks & Things", downloaded from www.engr.sjsu.edu May 18, 2005.
Motorola/Freescale Semiconductor, Inc, "Low Voltage Zero Delay Buffer", Motorola Semiconductor Technical Data—MPC961C/D—copyright 2001.
Steve Sharp, "PLL Design Techniques and Usage in FPGA Design", XILINX—Application Brief, XBRF 006 Aug. 28, 1996 (Version 1.1).
EXAR, "Intelligent Dynamic Clock Switch PLL Clock Driver", XRK7933, Mar. 2005.
NOVOF "Fully-Integrated CMOS Phase-Locked Loop with 15 to 240 MHz Locking Range and ±50 ps Jitter", Solid State Circuits Conference, 1995.

* cited by examiner

*Primary Examiner*—Sam K Ahn
(74) *Attorney, Agent, or Firm*—Matt Talpis; Mark P Kahler

(57) ABSTRACT

A frequency synthesizer lock detection system is disclosed that distributes a frequency synthesizer output signal across a distribution network to one or more receptor circuits. The distribution network may exhibit delay and other distortion that may cause the downstream signal arriving at the receptor circuit to lose frequency lock with both the frequency synthesizer output signal and a reference clock signal that controls the frequency of the synthesizer output signal. The lock detection system tests the downstream signal to determine if the downstream signal exhibits a lock with respect to the reference clock that determines the operating frequency of the frequency synthesizer. In this manner, lock of the downstream signal to the reference clock signal may be accurately assessed in one embodiment.

14 Claims, 11 Drawing Sheets

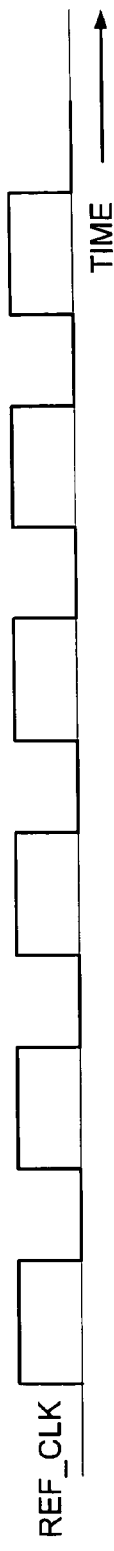
FIG. 2B REF_CLK
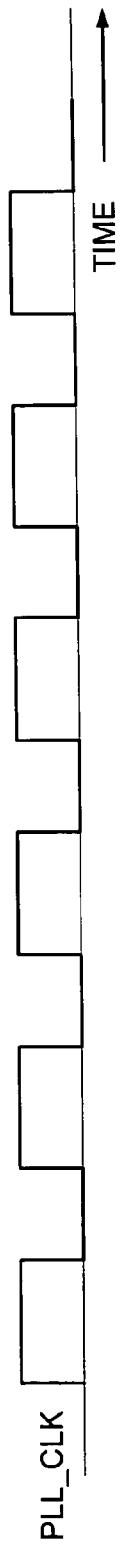
FIG. 2C PLL_CLK
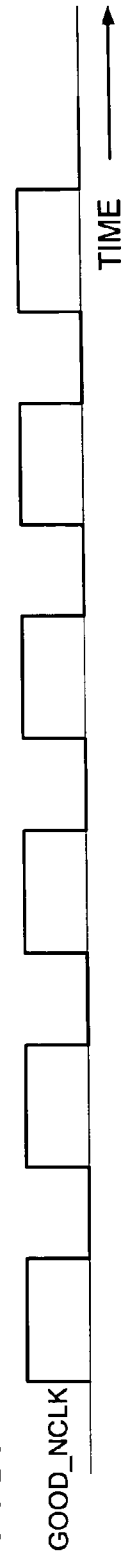
FIG. 2D GOOD_NCLK
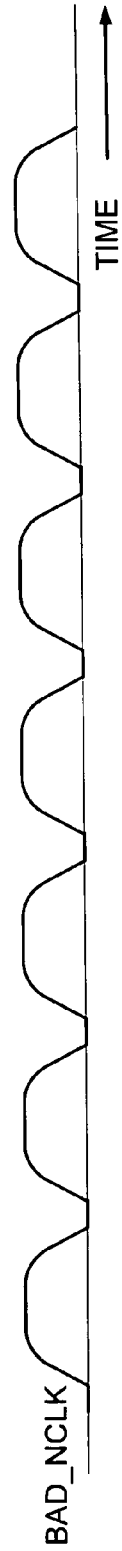
FIG. 2E BAD_NCLK
FIG. 2F PLL_LOCK  T1
FIG. 2G PLL_LOCK  T1

500

800

METHOD AND APPARATUS FOR DETECTING FREQUENCY LOCK IN A SYSTEM INCLUDING A FREQUENCY SYNTHESIZER

CROSS REFERENCE TO RELATED PATENT APPLICATIONS

This patent application is related to the U.S. patent application entitled "Information Handling System Capable of Detecting Frequency Lock of Signals Downstream From A Signal Synthesized By A Frequency Synthesizer", inventors Boerstler, et al., Ser. No. 11/236,834, filed Sep. 27, 2005 and assigned to the same assignee, the disclosure of which is incorporated herein by reference in its entirety.

TECHNICAL FIELD OF THE INVENTION

The disclosures herein relate generally to phase-locked loop (PLL) frequency synthesizers, and more particularly, to frequency lock detection in systems employing PLL synthesizers.

BACKGROUND

Phase-locked loop (PLL) frequency synthesizers form an important part of devices such as microprocessors, digital signal processors (DSPs), communication systems and other integrated circuit systems. A lock detector typically determines if a PLL output clock signal tracks a reference clock signal. The frequency synthesizer keeps the frequency of the PLL output clock signal locked to some multiple of a reference clock frequency by monitoring the PLL output clock signal.

In a practical integrated circuit (IC), a distribution network such as a clock tree may distribute a PLL output clock signal throughout the IC to receptor circuits that need the PLL output clock signal to properly function. Ideally, the PLL output clock signal should arrive at each receptor circuit in the distribution network without distortion in either frequency or phase as compared with the PLL output clock signal generated at the frequency synthesizer output. However, the PLL output clock signal may pass through many potential bandwidth-limiting blocks before arriving at the receptor circuits as a downstream clock signal. These bandwidth-limiting blocks may include level shifters, clocking buffers in a clocking grid, duty cycle correction circuits, clock multiplexers, pulse width limiters as well as other bandwidth-limiting circuits and devices. Thus, a downstream clock signal that actually reaches a receptor circuit in the distribution network may exhibit a somewhat different frequency and phase than the original PLL output clock signal generated at the frequency synthesizer output. If the frequency of the downstream clock signal varies too much from the frequency of the PLL output clock signal, then frequency lock may be lost and receptor circuits relying on the downstream clock signal may not function properly.

Lock detectors are known that detect when a PLL output signal of a frequency synthesizer exhibits the same frequency as a reference clock signal. One type of lock detector employs two counters. One counter counts the number of reference signal clock pulses and the other counter counts the number of feedback signal pulses. A divider circuit divides the number of PLL output signal pulses to produce the feedback signal. A comparator compares the number of feedback signal pulses with the number of reference clock signal pulses. If the number of feedback signal pulses equals the number of reference clock signal pulses, then the lock detector signals that the frequency synthesizer is locked. While this method determines the existence of a locked state at the immediate output of the frequency synthesizer, it is possible that a locked state may not exist downstream in circuits distant from the immediate output of the frequency synthesizer.

What is needed is a method and apparatus that determines if a downstream clock signal exhibits a frequency lock with respect to a frequency synthesized output clock signal.

SUMMARY

Accordingly, in one embodiment, a frequency synthesizer lock detection system is disclosed that includes a reference clock that generates a reference clock signal. The system also includes a frequency synthesizer having an input coupled to the reference clock and an output at which a synthesizer output signal is generated. The synthesizer output signal is locked in frequency to the reference clock signal. The system further includes a distribution network, coupled to the synthesizer output, that distributes the synthesizer output signal as a downstream signal. The system also includes a lock detector, coupled to the reference clock and the distribution network, that determines if the downstream signal is locked to the reference clock signal.

In another embodiment, a method is disclosed for determining lock between two signals. The method includes supplying a reference clock signal to a frequency synthesizer that generates a synthesizer output signal locked in frequency to the reference clock signal. The method also includes distributing, by a distribution network, the synthesizer output signal as a downstream signal to a receptor circuit situated downstream of the frequency synthesizer. The method further includes determining, by a lock detector, if the downstream signal is locked to the reference clock signal.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 2B-2G show waveforms associated with the system of FIG. 2A.

DETAILED DESCRIPTION

Figure 1:
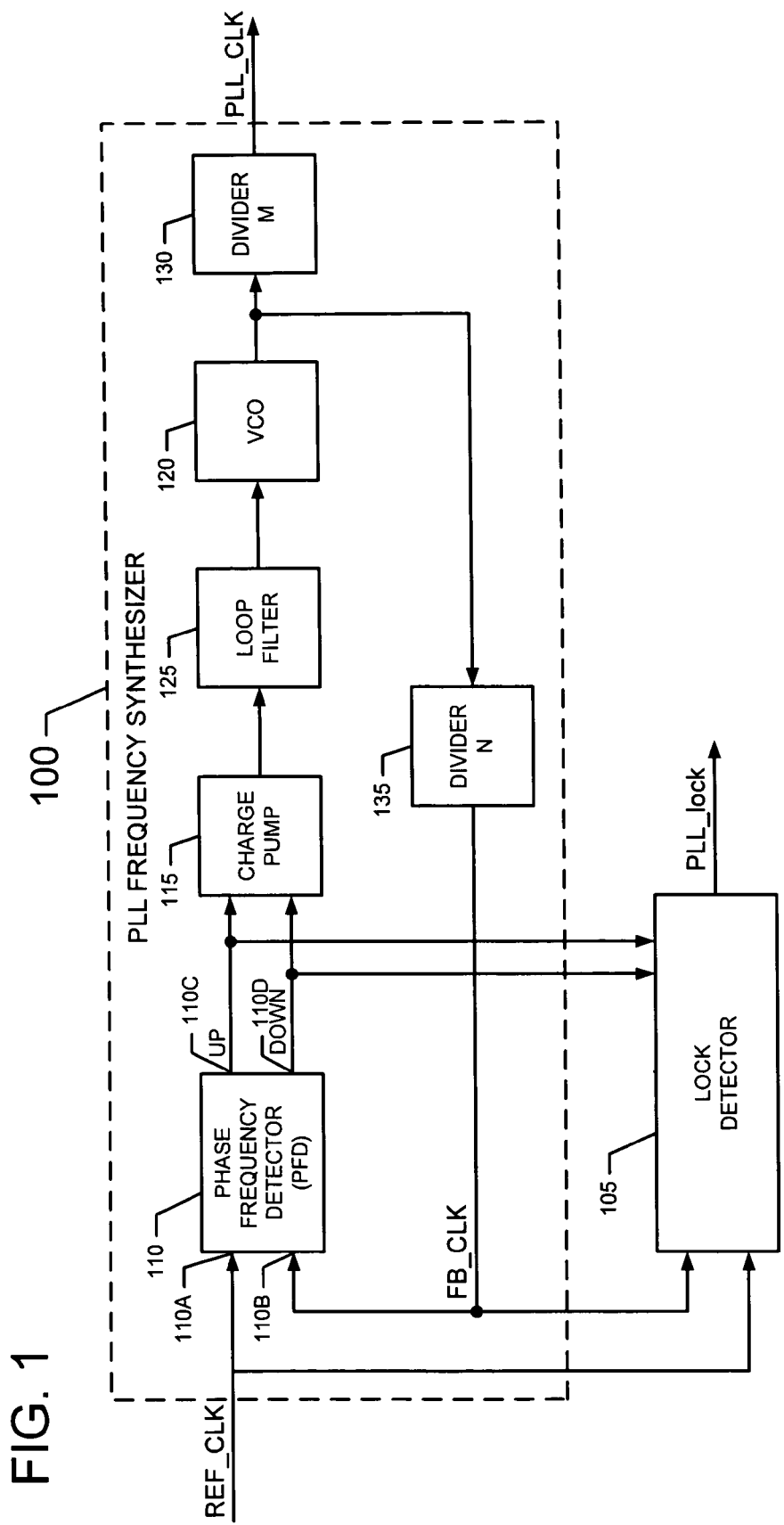
FIG. 1 shows a block diagram of a frequency synthesizer employing a lock detector.

FIG. 1 shows a PLL frequency synthesizer 100 that employs a lock detector 105 to assure that a feedback signal, FB_CLK, exhibits the same frequency as a reference clock signal, REF_CLK. Synthesizer 100 derives the feedback signal, FB_CLK, from a divided down version of a voltage controlled oscillator (VCO) signal. Frequency synthesizer 100 generates an output signal, PLL_CLK, that synthesizer 100 locks or synchronizes in frequency to the reference clock signal, REF_CLK. In more detail, frequency synthesizer 100 includes a phase frequency detector (PFD) 110 having a reference input 110A and a signal input 110B. PFD 110 also includes an UP output 110C and a DOWN output 110D. UP output 110C and DOWN ouput 110D couple to respective inputs of a charge pump 115 as shown. The output of charge pump 115 couples to a voltage controlled oscillator (VCO) 120 via a loop filter 125 therebetween. A divider 130 couples to the output of VCO 120 to divide the VCO output signal by a factor, M, thus generating a frequency synthesizer output signal, PLL_CLK, at a desired output frequency. A divider 135 couples to the output of VCO 120 to divide the VCO output signal by a factor, N, to provide a divided down feedback signal, FB_CLK, to signal input 110B of PFD 110.

In frequency synthesizer 100, the frequency of the PLL_CLK output signal, namely the synthesized output signal, equals the frequency of the reference clock signal, REF_CLK, times the ratio N/M. If the divided down feedback signal, FB_CLK, exhibits a frequency lower than the frequency of the REF_CLK reference clock signal, then PFD 110 detects this low frequency condition. In response, PFD 110 increases the voltage of the UP signal at UP output 110C to cause charge pump 115 to pump more charge into loop filter 125. This action drives the frequency generated by VCO 120 higher. However, if the divided down feedback signal, FB_CLK, exhibits a frequency higher than the frequency of the REF_CLK reference clock signal, then PFD 110 detects this high frequency condition. In response, PFD 110 increases the voltage of the DOWN signal at DOWN output 110D to cause charge pump 115 to pump less charge into loop filter 125. This action drives the frequency generated by VCO 120 lower. Lock detector 105 monitors the frequency of the reference clock signal, REF_CLK, and the feedback clock signal, FB_CLK. When the reference clock signal, REF_CLK, exhibits substantially the same frequency as the feedback clock signal, FB_CLK, lock detector raises the PLL_LOCK signal from low to high. A high PLL_LOCK signal indicates that the PLL_CLK output signal exhibits a frequency lock with respect to the reference clock signal, REF_CLK. In contrast, a low PLL_LOCK signal indicates that the PLL_CLK output signal does not exhibit a frequency lock with respect to the reference clock signal, REF_CLK.

Figure 2A:
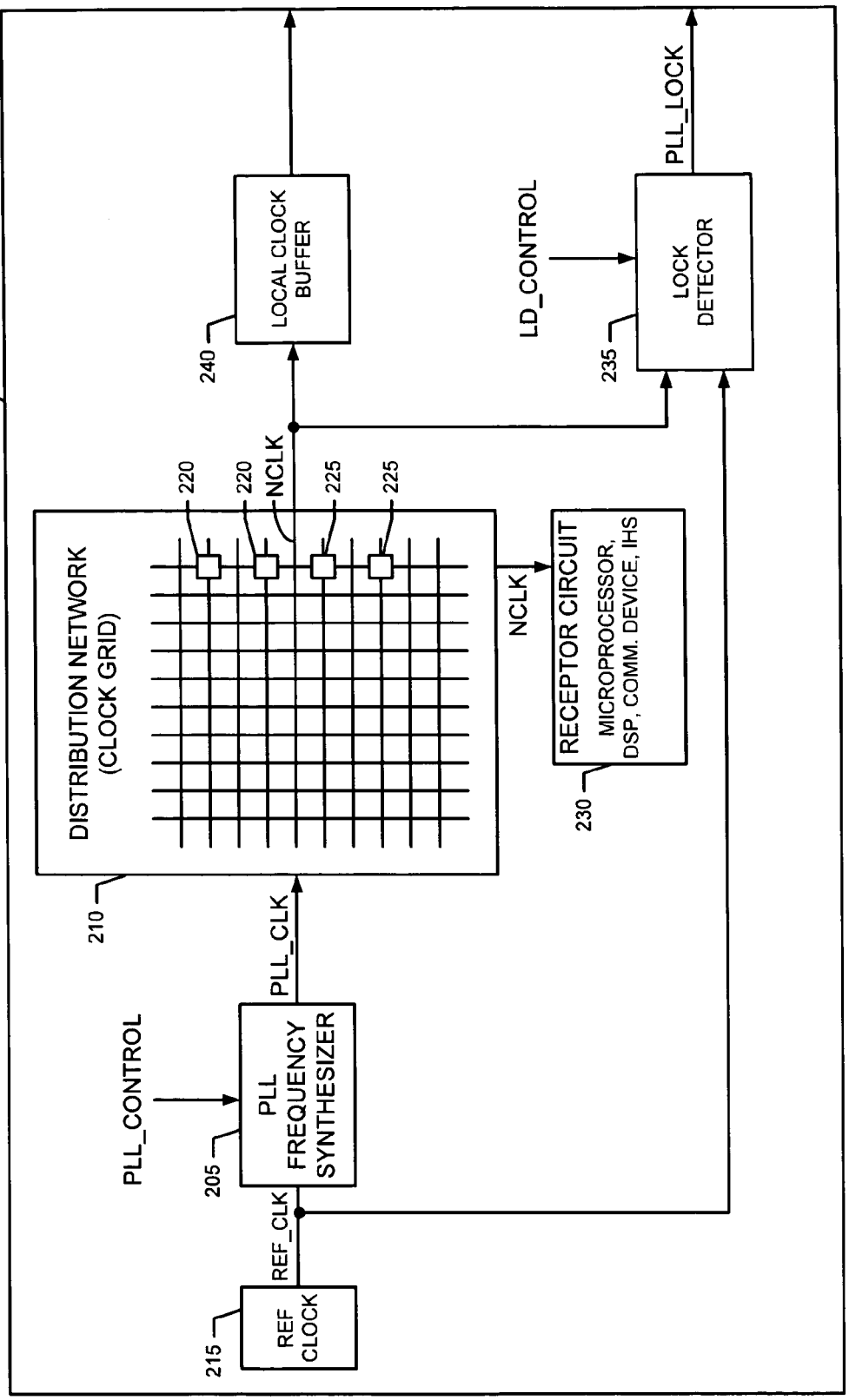
FIG. 2A shows a block diagram of the disclosed frequency synthesizer system with downstream lock detection capability.

FIG. 2A shows a block diagram of the disclosed frequency synthesizer system 200 with downstream lock detection capability. In one embodiment, frequency synthesizer system 200 takes the form of an integrated circuit (IC) 201. System 200 includes a PLL frequency synthesizer 205 that synthesizes and supplies a PLL_CLK signal to a distribution network or clock grid 210. In one embodiment, system 200 may employ frequency synthesizer 100 of FIG. 1 as frequency synthesizer 205 of FIG. 2A. Frequency synthesizer 205 generates an output signal, namely the PLL_CLK signal, that exhibits a frequency substantially in sync with the reference clock signal, REF_CLK. PLL frequency synthesizer 205 couples to reference clock 215 to receive the reference clock signal, REF_CLK, therefrom. The following Equation 1 determines the actual frequency of the PLL_CLK output signal.

$$\text{Freq. of } PLL\_CLK = \text{Freq. of } REF\_CLK * (N/M) \quad \text{EQUATION 1}$$

wherein N and M are defined above with respect to FIG. 1. System 200 supplies a control signal, PLL_CONTROL, to PLL frequency synthesizer 205 to instruct synthesizer 205 with respect to the particular M and N factors necessary for synthesizer 200 to generate a PLL_CLK output signal at the desired operating frequency. A designer or user may vary the M and N factors to achieve the desired operating frequency of the PLL_CLK signal.

A clock grid, clock tree or other distribution network 210 couples to the PLL_CLK output of frequency synthesizer 205 to distribute the PLL_CLK signal to other circuits and devices in IC 201. These circuits and devices include buffers 220 and receptor circuits 225 and 230. While FIG. 2A shows representative buffers 220 and receptor circuits 225 and 230, in actual practice system 200 may include many more buffers 220 and receptor circuits 225 and 230 than illustrated. Buffers 220 and receptor circuits 225 and 230 are referred to as downstream circuits and devices due to their position downstream from the PLL_CLK output for signal flow purposes. In one embodiment, distribution network 210 may couple to a receptor circuit 230 such as a microprocessor, digital signal processor, communication device, information handling system or other receptor circuit downstream from the PLL_CLK output. An information handling system (IHS) typically includes a processor coupled to system memory via a bus. Input and output devices couple to the bus to provide input and output of information for the IHS. Representative information handling systems include desktop, laptop, notebook, server, mainframe and minicomputer systems.

Receptor circuits may also couple to distribution network 210 via local clock buffer 240 to receive an NCLK signal or directly to distribution network 210 to receive the NCLK signal. The designation, NCLK, refers to the PLL_CLK signal after it passes through at least a portion of distribution network 210. Thus, the NCLK signal is downstream of frequency synthesizer 205 output PLL_CLK. Typically, the NCLK signal refers to the PLL_CLK signal after it passes through one or more buffers 220 or receptor circuits 225. In other words the NCLK signal is the downstream version of the PLL_CLK signal after the PLL_CLK signal passes through at least a portion of a potentially delay causing network such as network 210. Under some circumstances, the PLL_CLK signal may encounter delay, skewing and other distortion as it passes through distribution network 210. Ideally the NCLK signal should exhibit the same frequency as the PLL_CLK signal even after passing through distribution network 210. In other words, the downstream NCLK signal should be locked in frequency to the PLL_CLK signal which itself is locked to the reference clock signal, REF_CLK.

Frequency synthesizer system 200 positions lock detector 235 downstream of PLL frequency synthesizer 205. In an embodiment wherein M/N=1 to simplify system 200 for discussion purposes, by definition, the frequency of the PLL_CLK signal=the frequency of REF_CLK signal. In this case, ideally the frequency of the downstream NCLK signal equals the frequency of the PLL_CLK signal and the frequency of the downstream NCLK signal locks to the frequency of the PLL_CLK signal and the frequency of the REF_CLK signal. In this embodiment, lock detector circuit 235 monitors the downstream NCLK signal to determine if the downstream NCLK signal exhibits the same frequency as the REF_CLK signal. If lock detector 235 determines that the downstream NCLK signal exhibits the same frequency as the REF_CLK signal, then lock detector 235 raises the PLL_LOCK signal high to indicate frequency lock. However, if lock detector 235 determines that the downstream NCLK signal does not exhibit the same frequency as the REF_CLK signal, then lock detector 235 sets the PLL_LOCK signal to low to indicate that the NCLK signal does not exhibit a frequency lock.

Alternatively, in an embodiment where M/N≠1, lock detector circuit 235 determines if the downstream NCLK signal exhibits a multiple or ratio of the REF_CLK signal as given by EQUATION 1 above. In other words, lock detector circuit 235 determines if the downstream NCLK signal is in sync with the REF_CLK signal. In one embodiment, lock detector 235 may determine if the frequency of the NCLK signal multiplied by the ratio N/M equals the same frequency as the frequency of the PLL_CLK signal. In one embodiment, system 200 includes a local clock buffer 240 coupled to distribution network 210 to buffer the NCLK signal before the NCLK signal passes to other circuitry (not shown).

FIG. 2B shows a time vs. amplitude graph of the REF_CLK signal. FIG. 2C shows a time vs. amplitude graph of a PLL_CLK signal exhibiting the same frequency as the REF_CLK signal. In this scenario, the PLL_CLK signal locks to the frequency of the REF_CLK signal. FIG. 2D shows a time vs. amplitude graph of a GOOD_NCLK signal, namely an NCLK signal that is good because it exhibits the same frequency as the REF_CLK signal. In other words, the GOOD_NCLK signal exhibits a frequency lock or sync with respect to the REF_CLK signal. FIG. 2E shows a time vs. amplitude graph of a BAD_NCLK signal, namely an NCLK signal that is bad because it does not exhibit the same frequency as the REF_CLK signal. In other words, the BAD_NCLK signal does not exhibit a frequency lock or sync with respect to the REF_CLK signal. FIG. 2F shows a time vs. amplitude graph of the PLL_LOCK signal that exhibits a low state to indicate the absence of synchronization or lock of the NCLK signal to the REF_CLK signal. Time T1 denotes the time when lock detector 235 starts determining if the PLL_CLK signal is in sync with the REF_CLK signal. FIG. 2G shows a time vs. amplitude graph of the PLL_LOCK signal that exhibits a high state to indicate synchronization of the NCLK signal to the REF_CLK signal. If that case, a locked condition or state exists.

Figure 3A:
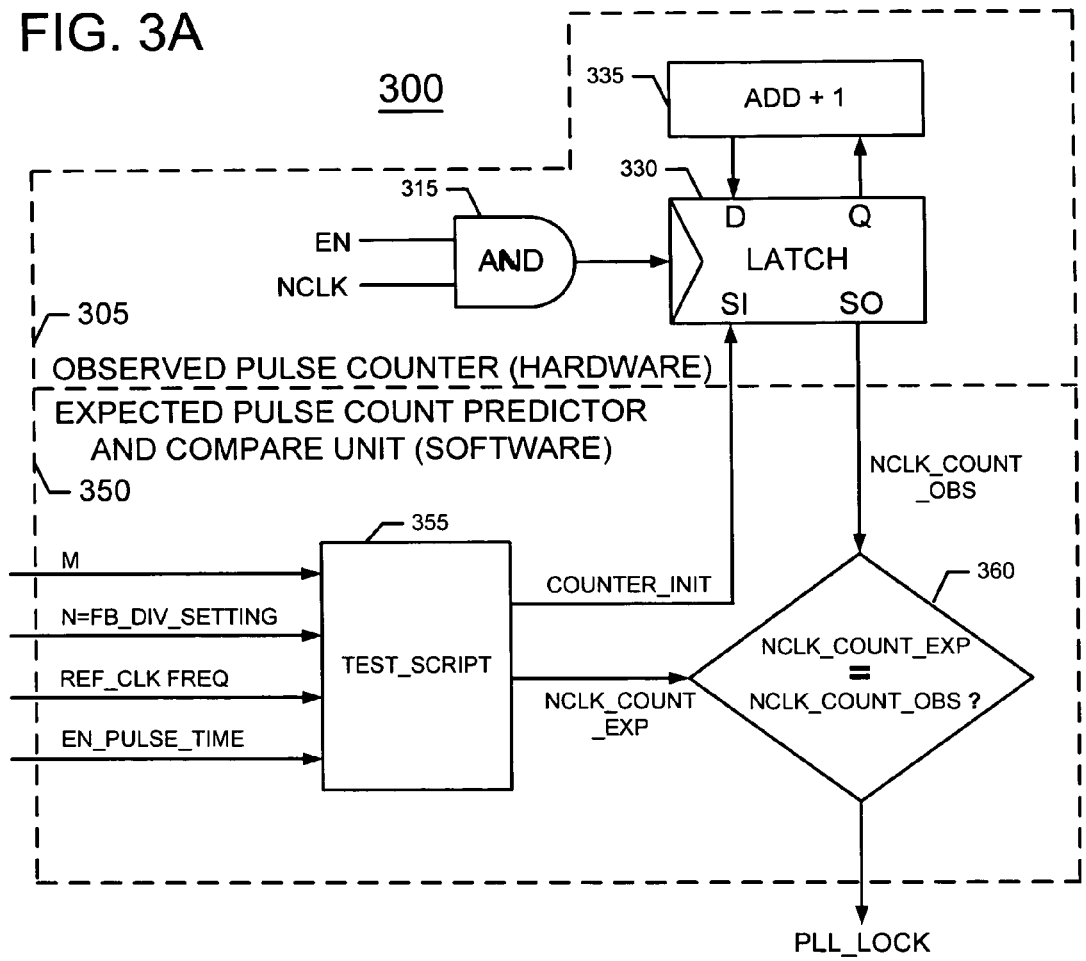
FIG. 3A shows another embodiment of the disclosed system with a lock detector that includes a hardware-based observed pulse counter and a software-based expected pulse count predictor and compare unit.

FIG. 3A shows a lock detector 300 that system 200 of FIG. 2A may employ as lock detector 235. Lock detector 300 employs a counter and associated circuitry and software to determine if a locked condition exists between the NCLK signal and the REF_CLK signal. In one embodiment, lock detector 300 employs a single counter. More particularly, lock detector 300 includes an observed pulse counter 305 that counts the number of rising edges of the NCLK signal during a test window exhibiting a predetermined time duration. NCLK_COUNT_OBS refers to the number of rising edges of NCLK actually counted or observed during the test window. Lock detector 300 then compares NCLK_COUNT_OBS with NCLK_COUNT_EXP, the number of rising edges that expected pulse count predictor and compare unit 350 expects for this particular time window. If NCLK_COUNT_OBS equals NCLK_COUNT_EXP, then a locked condition exists between the NCLK signal and the REF_CLK signal. If NCLK_COUNT_OBS does not equal NCLK_COUNT_EXP, then a locked condition does not exist between the NCLK signal and the REF_CLK signal.

Figure 3B:
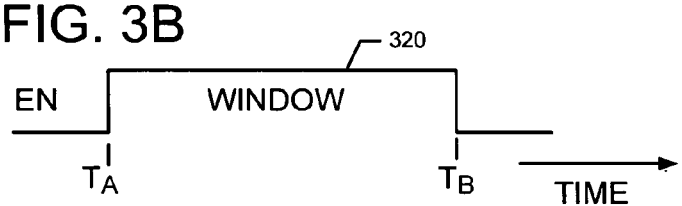
FIG. 3B shows a timing diagram of the test window associated with the lock detector of FIG. 3A.
Figure 3C:
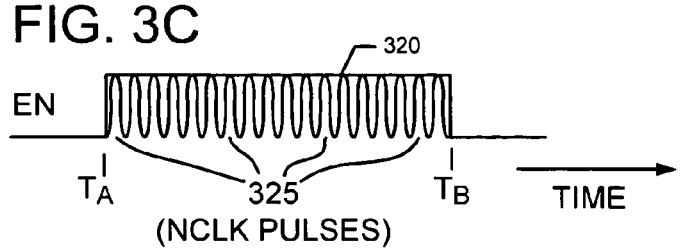
FIG. 3C shows a timing diagram of a test window and NCLK pulses occurring during that test window.

In more detail, observed pulse counter 305 includes an AND gate 315 that functions as a window generator to provide the test window discussed above. Lock detector 300 supplies the NCLK signal to one input of AND gate 315. Lock detector 300 supplies an enable signal, EN, to the other input of AND gate 315. Whenever the EN input goes high, AND gate 315 passes NCLK pulses through to the output of AND gate 315. Thus, the duration of the EN enable signal determines the duration, of the test window. FIG. 3B and 3C together illustrate the operation of AND gate 315 to provide a test window 320. In FIG. 3B the enable signal, EN, goes high at time $T_A$ and goes low at time $T_B$ to form window 320. Thus, as illustrated in FIG. 3C, the window encompasses all of the NCLK pulses 325 that occur during the window from time $T_A$ and to time $T_B$.

The output of AND gate 315 couples to a clock input of latch 330. Latch 330 further includes inputs D and SI and outputs Q and SO. Thus, the window generator formed by AND gate 315 provides each EN pulse 325 occurring during the test window 320 to latch 330. Incrementer 335 couples to the D input and the Q output of latch 330 as shown in FIG. 3A. To commence counting NCLK pulses 325 observed during a test window 320, the expected pulse count predictor and compare unit 350 supplies an initialization signal COUNTER_INIT to the SI input of latch 330. This initializes the count value in latch 330 at zero and the initial value in incrementer 335 at zero. When the EN signal goes high the first NCLK pulse 325 during window 320 flows from AND gate 315 to the clock input of latch 330. In response, the Q output of latch 330 goes high. Incrementer 335 increments the value therein by one and supplies the now incremented value to the D input of latch 330 for storage of a count value. In this manner, observed pulse counter 305 counts the first NCLK pulse of the test window 320. AND gate 315 then supplies the second NCLK pulse 325 of test window 320 to latch 330. In response, incrementer 335 increments its value by 1 and supplies the incremented value to latch 330 which stores the updated count value. This process continues until observed pulse counter 305 counts all of the NCLK pulses occurring during the test window 320. The counting of NCLK pulses 325 ceases when the EN signal of test window 320 goes low. This occurs because no more NCLK pulses 325 pass through window generator AND gate 315 once the EN signal returns to zero to define the end of the test window at time $T_B$. Thus, operating together, window generator AND gate 315, latch 330 and incrementer 335 form the observed pulse counter 305 that counts the number of NCLK pulses 325 occurring during test window 320. In the embodiment described above, lock detector 300 implements observed pulse counter 305 in hardware.

Lock detector 300 couples the SO output of latch 330, namely the latch which stores the actual number of NCLK pulses 325 observed during the test window 320, to an expected pulse count predictor and compare unit 350. In this manner, expected pulse count predictor and compare unit 350 receives the observed pulse count, NCLK_COUNT_OBS, for window 320. Expected pulse count predictor and compare unit 350 now compares the observed pulse count for window 320, NCLK_COUNT_OBS, with the expected pulse count, NCLK_COUNT_EXP, for a hypothetical window having the same time duration as test window 320. If the observed pulse count equals the expected pulse count, then lock detector 300 toggles the PLL_LOCK signal high to indicate a frequency lock. However, if the observed pulse count does not equal the expected pulse count, then lock detector 300 toggles the PLL_LOCK signal low to indicate no frequency lock.

Lock detector 300 implements expected pulse count predictor and compare unit 350 in application software in one embodiment. In such an embodiment, expected pulse count predictor and compare unit 350 includes a test script 355 to which lock detector 300 supplies the following values:

M—the divider value applied to the output signal of VCO 120 to produce the synthesized PLL_CLK signal;

N—the divider value applied to the output signal of VCO 120 to produce the feedback signal, FB_CLK. Alternatively, the signal FB_DIV_SETTING provides the value N;

REF_CLK_FREQ—the frequency of the reference clock signal, REF_CLK; and

EN_PULSE_TIME—a signal that defines the duration of test window 320.

Test script 355 represents software code that determines the expected NCLK count, NCLK_COUNT_EXP, for a frequency synthesizer 205 that supplies a PLL_CLK signal to a hypothetical distribution network or clock grid 210 with zero delay or other distortion. In such an ideal situation, NCLK=PLC_CLK. Given the variables M, N, REF_CLK_FREQ and EN_PULSE_TIME (test window duration), test script 355 employs EQUATION 1 above to determine the corresponding expected NCLK count NCLK_COUNT_EXP. Test script 355 supplies the expected NCLK_COUNT_EXP value to a compare operation 360 as shown in FIG. 3A.

Figure 3D:
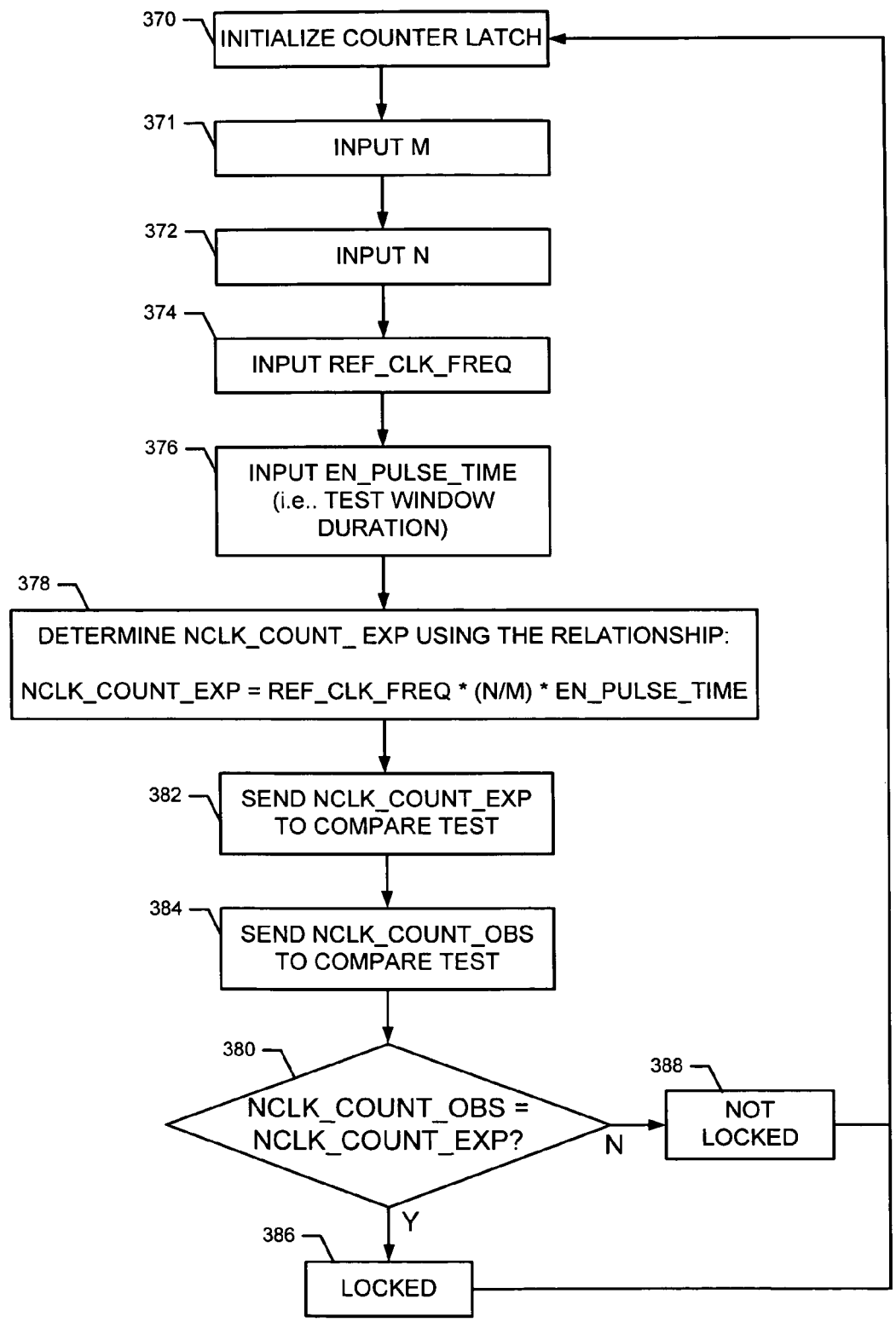
FIG. 3D depicts a flowchart that describes process flow in the lock detector of FIG. 3A

FIG. 3D shows a flowchart describing a representative test script 355 or application software that determines the expected NCLK count, NCLK_COUNT_EXP given M, N, REF_CLK_FREQ and the EN_PULSE_TIME (test window duration). As per block 370, test script 355 supplies counter latch 330 with an initialization value, COUNTER_INIT, to set the count value in latch 330 to zero before latch 330 commences counting the NCLK pulses during a test window 320. Test script 355 operates in the following manner to determine the number of NCLK pulses that should occur in test window 320. Lock detector 300 supplies the M and N values to test script 355 as per blocks 371 and 372, respectively. The values of M and N determine the particular frequency at which frequency synthesizer 205 generates the synthesized PLL_CLK output signal. A designer or user can vary or select the values of M and N to determine the desired output frequency of the synthesizer. Lock detector 300 also supplies the reference clock frequency, REF_CLK_FREQ, to test script 355 as per block 374. Lock detector 300 further supplies the time duration of the test window, namely EN_PULSE_TIME, to test script 355 as per block 376. Using the M, N, REF_CLK_FREQ and EN_PULSE_TIME information, test script 355 determines the expected number of pulses in NCLK_COUNT_EXP according to the following Equation 2, as per block 378.

$$NCLK\_COUNT\_EXP = REF\_CLK\_FREQ * (N/M) * EN\_PULSE\_TIME \quad \text{EQUATION 2}$$

In one embodiment, test script 355 determines NCLK_COUNT_EXP in real time using Equation 2. In another embodiment, test script 355 employs a look-up table (not shown) of the variables REF_CLK_FREQ, N, M, EN_PULSE_TIME and their corresponding expected pulse count NCLK_COUNT_EXP values. Lock detector 300 may determine the NCLK_COUNT_EXP values at any convenient time. When lock detector 300 employs longer test windows, observed pulse counter 305 counts more NCLK pulses thus achieving greater resolution in the NCLK_COUNT_OBS count. Correspondingly, when lock detector 300 employs longer test windows, the number of expected pulses in the clock window, NCLK_COUNT_EXP, likewise increases.

In the flow chart of FIG. 3D, test script 355 sends the expected NCLK pulse count, NCLK_COUNT_EXP, for window EN_PULSE_TIME to a compare block 380 as per block 382. Observed pulse counter 305 also sends the observed pulse count NCLK_COUNT_OBS for window EN_PULSE_TIME to compare block 380 as per block 384. Compare block 380 performs a test to determine if the observed NCLK pulse count NCLK_COUNT_OBS equals the expected NCLK pulse count NCLK_COUNT_EXP for a window of duration, EN_PULSE_TIME. If compare block 380 determines that NCLK_COUNT_OBS=NCLK_COUNT_EXP, then the downstream PLL output signal, namely the NCLK signal, exhibits synchronization with respect to the REF_CLK reference clock signal as per block 386. In this event, lock detector 300 raises the PLL_LOCK signal to a logic high to indicate lock. Process flow continues back to initialize counter latch block 370 for additional lock testing if desired. However, if compare block 380 determines that NCLK_COUNT_OBS≠NCLK_COUNT_EXP, then the downstream PLL output signal, namely the NCLK signal, does not currently exhibit synchronization with respect to the REF_CLK reference clock signal as per block 388. In this event, lock detector 300 lowers the PLL_LOCK signal to a logic low to indicate lock failure. Process flow continues back to initialize counter latch block 370 for additional lock testing if desired.

While in the embodiment discussed above, lock detector 300 counted the number of rising edges of the NCLK pulse signals, in another embodiment lock detector may count the number of falling or trailing edges of the NCLK pulse signals. This will achieve the same result, namely NCLK_COUNT_OBS, the number of NCLK pulses observed by observed pulse counter 305. In one embodiment, test window 320 exhibits a time duration of approximately 20ns, although greater and lesser time durations work as well depending upon the particular application. Longer test windows 320 offer increased resolution while shorter test windows 320 provide less resolution. One other embodiment may compare the number of observed pulses of the downstream NCLK signal with the number of expected pulses NCLK_COUNT_EXP of the NCLK signal. In this operational scenario, the number of expected pulses of the NCLK signal equals the number of pulses of the PLL_CLK signal for the same time duration window. In one embodiment, other systems may re-use the counter formed by incrementer 335 and latch 330 once lock detector 300 determines that either a locked state or a not locked state exists.

Figure 4:
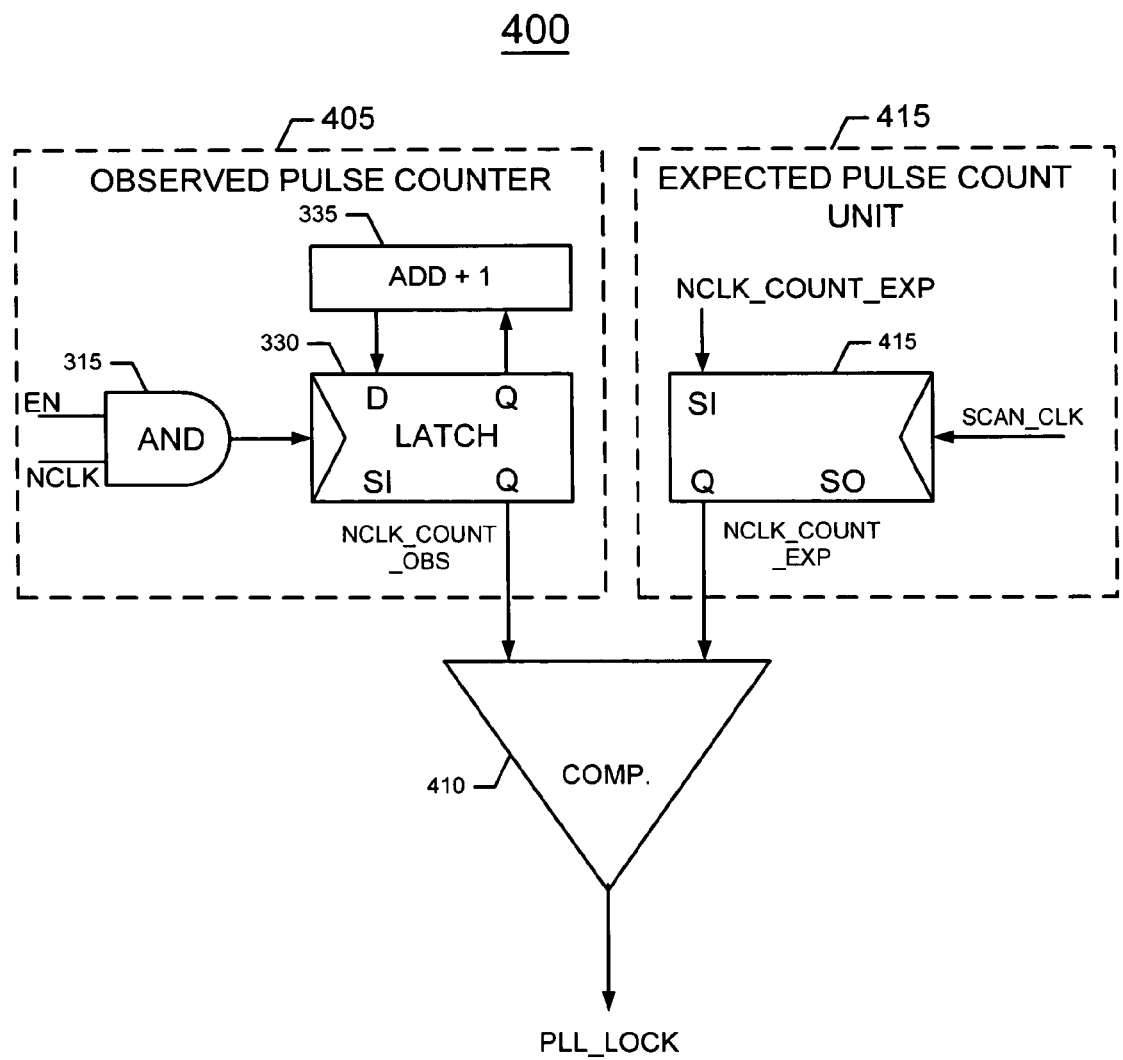
FIG. 4 shows another embodiment of the system that includes a lock detector having an observed pulse counter and an expected pulse count unit.

While FIG. 3A-3D show a hardware—software approach to lock detection, FIG. 4 depicts a hardware approach to lock detection, namely lock detector 400. Lock detector 400 includes an observed pulse counter 405 configured in the same manner as observed pulse counter 305 of FIG. 3A. Like numerals indicate like components when comparing observed pulse counter 405 of FIG. 4 and observed pulse counter 305 of FIG. 3A. For a particular enable signal EN that defines a test window of predetermined duration during which latch 330 counts NCLK pulses, the total number of NCLK pulses observed during that test window appears at the Q output of latch 330 as the NCLK_COUNT_OBS value. The Q output of latch 330 couples to one input of a two input comparator 410. In this manner, observed pulse counter 405 supplies comparator 410 with the NCLK_COUNT_OBS value.

Lock detector 400 also includes an expected pulse count unit 415 that provides the expected NCLK pulse count corresponding to the predetermined duration of the test window, namely NCLK_COUNT_EXP, to the remaining input of comparator 410. The designer knows the frequency of the REF_CLK signal, the M and N values, and the selected duration of the test window since the designer controls or can select theses values. Using Equation 2, the designer can determine the number of NCLK pulses expected, NCLK_COUNT_EXP, for a test window exhibiting the selected time duration. In this manner, the selected values of REF_CLK, M, N and test window time duration predefine the number of pulses expected, NCLK_COUNT_EXP. Lock detector 400 supplies this expected value, NCLK_COUNT_EXP to latch 415. More particularly, lock detector 400 scans this NCLK_COUNT_EXP value into latch 415 upon instruction by the SCAN_CLK signal at the clock input of latch 415. Lock detector 400 gates the SCAN_CLK signal off during the counting operation conducted by observed pulse counter 405 so that latch 415 holds the NCLK_COUNT_EXP value. The Q output of latch 415 couples, to the remaining input of comparator 410 so that comparator 410 receives a value corresponding to the expected number of NCLK pulses, namely the NCLK_COUNT_EXP value.

Comparator 410 of lock detector 400 determines if the number of observed pulses, NCLK_COUNT_OBS, equals the expected number of pulses, NCLK_COUNT_EXP. If comparator 410 finds that NCLK_COUNT_OBS=NCLK_COUNT_EXP, then comparator 410 raises the PLL_LOCK signal at its output to a logic high to indicate lock of the NCLK signal to the REF_CLK signal. However, if comparator 410 finds that NCLK_COUNT_OBS≠NCLK_COUNT_EXP, then comparator 410 lowers the PLL_LOCK signal at its output to a logic low to indicate absence of lock of the NCLK signal to the REF_CLK signal.

In the embodiment of lock detector 400 shown in FIG. 4, lock detector 400 scans the expected NCLK count, namely the NCLK_COUNT_EXP value, into the latch 415 of expected pulse count unit 415. In another embodiment, expected pulse count unit 415 may count the actual REF_CLK pulses occurring during a test window equal in duration to the test window that observed pulse counter 405 employs. Count unit 415 then multiplies the number of REF_ CLK pulse counted during the test window by the ratio N/M times the test window duration to determine the number of NCLK pulses expected to occur during the test window. Expected pulse count unit 415 then provides this expected NCLK pulse count, NCLK_COUNT_EXP, to an input of comparator 410 as shown.

Figure 5:
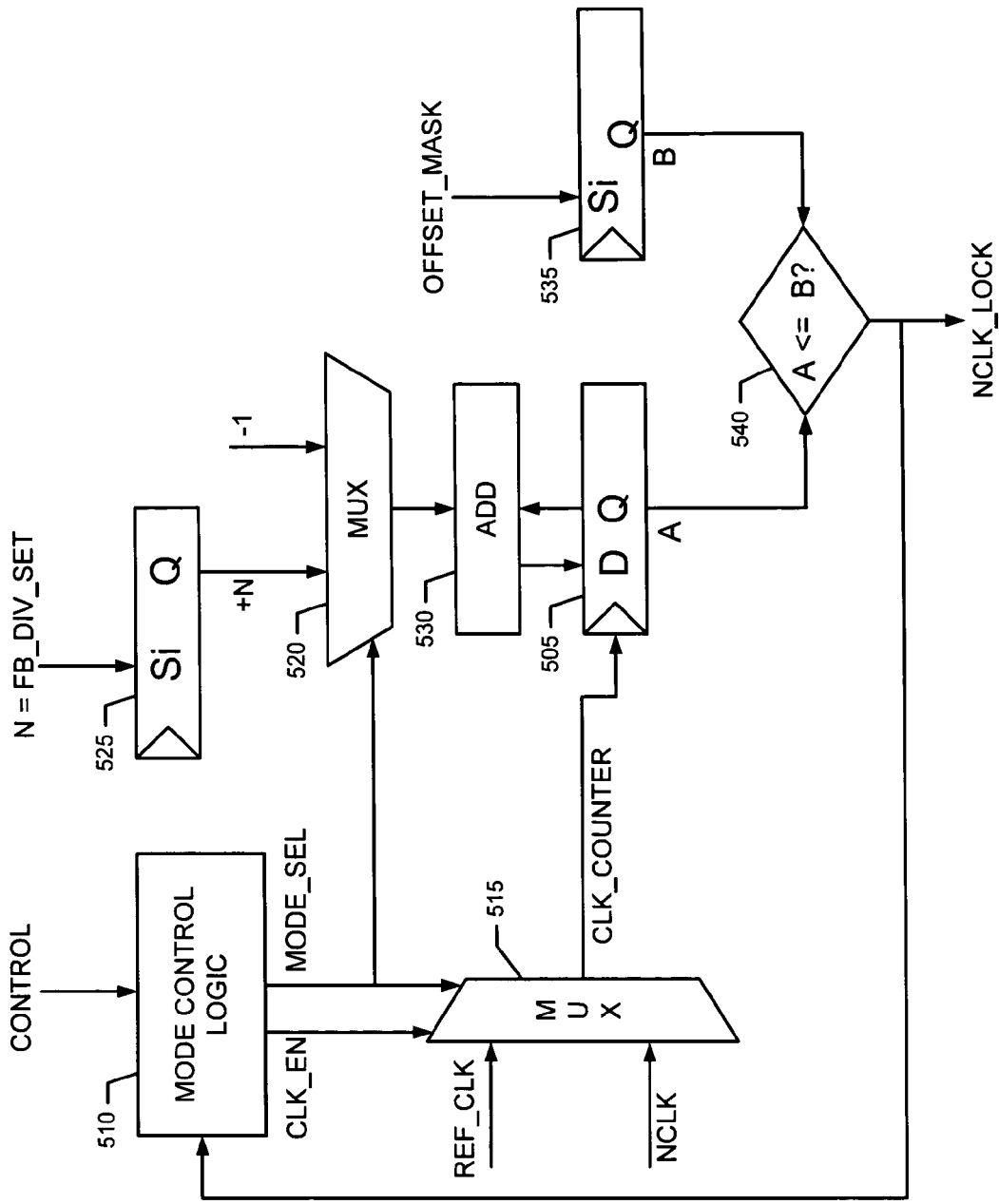
FIG. 5 shows another embodiment of the disclosed system that includes a single counter with count up and count down capability to determine a locked condition.

FIG. 5 shows a lock detector 500 that system 200 of FIG. 2A may employ as lock detector 235. Lock detector 500 first operates in a count up mode to count up the number of REF_CLK pulses occurring during a REF_CLK window. Then, lock detector 500 switches to a count down mode to count the number of actual NCLK pulses occurring during an NCLK window exhibiting the same time duration as the REF_ CLK window. When the NCLK signal exhibits a lock with respect to the REF_CLK signal, the number of NCLK pulses equals N times the number of counted REF_CLK pulses. This occurs due to the action of divider 135 of FIG. 1, namely divider N. In an embodiment wherein N=4, for each REF_ CLK pulse there will be 4 PLL_CLK and 4 NCLK pulses if divider M equals one. In the embodiment of lock detector 500 depicted in FIG. 5, detector 500 adds N, namely 4 counts, to count register 505 for each REF_CLK pulse actually counted during the REF_CLK window. Thus, the pulse count up total value present in count register 505 when the REF_CLK window ends should be equal to the number of NCLK pulses counted during a window of the same duration, provided NCLK exhibits a frequency lock with respect to REF_CLK. In the count down mode, lock detector 500 counts down from the pulse count up total value in count register 505 by 1 count for each NCLK pulse counted during an NCLK window exhibiting the same time duration as the REF_CLK window. If a locked condition exists wherein NCLK exhibits a frequency lock with respect to REF_CLK, then at the end of the count down during the NCLK window, the value stored in register count 505 decrements to a final value of zero. Thus, a zero value in count register 505 after count up mode and count down mode complete indicates that NCLK exhibits a frequency lock with respect to REF_CLK.

As seen in the schematic diagram of FIG. 5, lock detector 500 includes mode control logic 510 that includes a control input to which lock detector 500 applies a CONTROL signal. Mode control logic 510 includes CLK_EN and MODE_SEL outputs which provide CLK_EN and MODE_SEL signals respectively. In response to the CONTROL signal, mode control logic 510 generates a CLK_EN clock enable signal which together with the MODE_SEL mode select signal controls the duration and timing of the REF_CLK window during count up mode and the duration and timing of the NCLK window during the count down mode. The CLK_EN and MODE_SEL outputs of mode control logic 510 couple to respective control inputs of multiplexer 515. Multiplexer 515 includes REF_CLK and NCLK inputs to which lock detector 500 supplies the REF_CLK and NCLK signals, respectively. In this manner multiplexer 515 can send either the REF_CLK signal or the NCLK signal through to the output of multiplexer 515 depending on the state of mode select signal MODE_SEL. CLK_COUNTER designates the output signal of multiplexer 515 which as explained above can consist of REF_CLK pulses or NCLK pulses. The output of multiplexer 515 couples to the clock input of storage latch or count register 505.

The MODE_SEL output of mode control logic 510 also couples to the control input of a multiplexer 520. Multiplexer 520 includes a +N input to which a storage latch 525 supplies the N value, namely the value of the feedback divider 135 seen in synthesizer 100. When lock detector 500 initializes, detector 500 scans the value N=FB_DIV_SET into an Si input of latch 525. This instructs lock detector 500 regarding how many counts to apply to count register 505 for each REF_CLK pulse counted during count up mode. In this particular example, N=4, so detector 500 counts 4 counts for each REF_CLK pulse counted during the count up mode.

Figure 6:
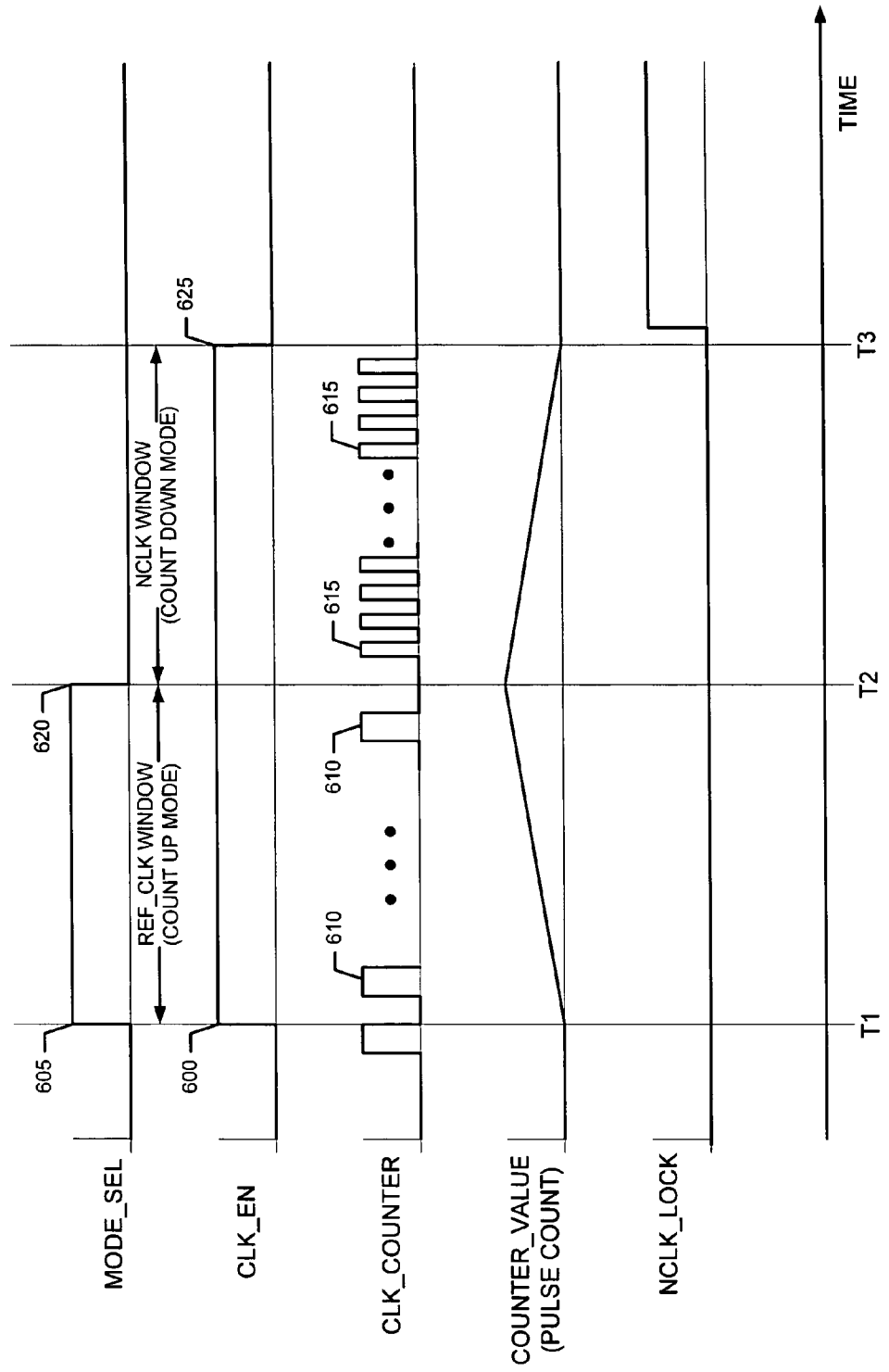
FIG. 6 shows a timing diagram depicting waveforms associated with the system of FIG. 5.

The Q output of latch 525 couples to one input of two input multiplexer 520 to provide the +N value or setting thereto. Lock detector 500 supplies a "−1" value to the remaining input of multiplexer 520. Under the direction of mode control logic 510, the MODE_SEL mode select signal can select either the +N value or the −1 value for multiplexer 520 to pass through to its output. More specifically, under the direction of mode control logic 510, the CLK_EN signal goes high at 600 in FIG. 6 to instruct multiplexer 515 to start passing signals through to the output of multiplexer 515. Then to commence count up mode and the corresponding REF_CLK window at time T1, the MODE_SEL signal transitions high at 605. When the MODE_SEL signal goes high, multiplexer 515 sends the REF_CLK pulses to the clock input of register 505 as the CLK_COUNTER signal. Moreover, when the MODE_SEL signal goes high, multiplexer 520 supplies the +N value (4 in this particular example) to the input of adder 530. As seen in the CLK_COUNTER timing diagram of FIG. 6, for each CLK_COUNTER pulse 610 supplied to register 505 in the count up mode, adder 530 adds N counts 615 to the count value stored in register 505. (Detector 500 initializes register 505 with a zero count.). Thus, in this particular example wherein N=4, register 505 counts 4 pulses 615 for each pulse 610, as seen in the CLK_COUNTER timing diagram of FIG. 6. In another example wherein N=10, register 505 would count 10 pulses 615 for each pulse 610. Continuing in the manner described above, for the duration of the REF_CLK window, register 505 continues counting 4 pulses for each CLK_COUNTER pulse received from multiplexer 515. Thus, the pulse count (COUNTER_VALUE) stored in register 505 climbs from an initial value of zero at the beginning of the REF_CLK window, namely at time T1 to a pulse count up total, COUNTER_VALUE, at the end of the REF_CLK window, namely at time T2. The COUNTER _VALUE (pulse count) seen in the timing diagram of FIG. 6 thus climbs to a peak value, pulse count up total, at the end of the count up mode at time T2.

Mode control logic 510 causes the MODE_SEL mode select signal to transition low at 620 to end the REF_CLK window at time T2. When the REF_CLK window ends, the count up mode ends thus leaving a pulse count up total in register 505. At the end of the REF_CLK window, the NCLK window begins also at time T2 as seen in the MODE_SEL signal timing diagram of FIG. 6. The low transition of the MODE_SEL signal causes multiplexer 515 to start passing the NCLK pulses through to its output as the CLK_COUNTER signal. The low transition of the MODE_SEL signal also cause multiplexer 520 to start passing through the −1 value to adder 530. In this manner, for the duration of the NCLK window, detector 500 operates in a count down mode wherein detector 500 decrements the pulse count up total previously stored in register 505 by 1 for each NCLK pulse actually counted during the NCLK window. If the NCLK signal exhibits a lock with respect to the REF_CLK signal, then the final pulse count value, A, stored in register 505 equals zero at time T3, the end of the NCLK window. Mode control logic 510 transitions the CLK_EN signal low at 625 to end the NCLK window and the count down mode at time T3.

If the NCLK signal exhibits a precise frequency lock with the REF_CLK signal, then the final pulse count value stored in register 505 equals zero. In real applications, a final pulse count value of 1, 2 or other relatively low number of pulses may yield acceptable results for the NCLK signal to lock with the REF_CLK signal as long as lock detector 500 employs a consistent offset. To address this situation, one embodiment of lock detector 500 includes a latch 535 that receives an OFFSET_MASK when lock detector 500 initializes. The OFFSET_MASK equals a number of pulses by which the final pulse count value may vary from zero while still yielding acceptable results. For example, possible values of the OFFSET_MASK may be 1, 2 or higher depending on the particular application. "A" designates the Q output of register 505 such that "A" corresponds to the final pulse count total in register 505, namely 0, 1, 2, −1, −2, or other relatively low value for which substantial lock exists. "B" designates the Q output of latch 535 such that "B" corresponds to the value of the OFFSET_MASK, namely the acceptable error as measured in NCLK pulses. Lock detector 500 couples both the A and B outputs to a comparator 540. If A is less than or equal to B, then the error is acceptable and lock exists. In other words, the NCLK signal is substantially locked to the REF_CLK signal. In this case, the NCLK_LOCK signal seen in the timing diagram of FIG. 6 transitions high after time T3 to signify the substantial or approximate lock. However, if A is not less than or equal to B, then no lock exists and NCLK_LOCK remains low or transitions low if a locked condition existed earlier. If zero error is desirable then a designer or user sets the OFFSET_MASK to zero.

In the lock detector 500 described above, the pulse count total in register 505 at the end of the REF_CLK window equals the number of NCLK pulses expected to occur during an NCLK window of equal duration. Lock detector 500 counts down the number of NCLK pulses actually encountered by detector 500 during the NCLK window. In one embodiment, if the final pulse count value in count register 505 is zero after the count down, then the NCLK signal exhibits a frequency lock with respect to the REF_CLK signal.

Figure 7:
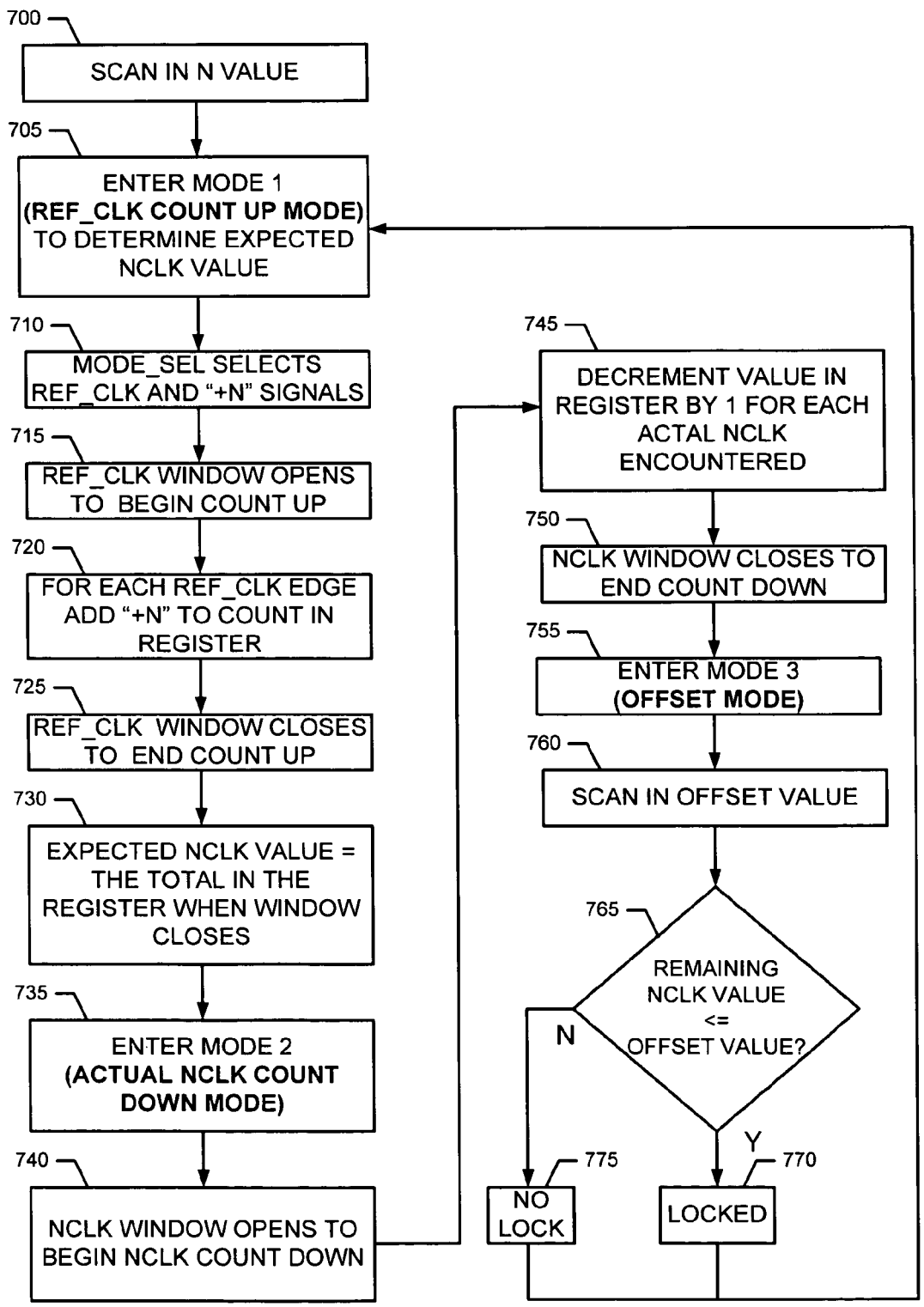
FIG. 7 shows a flowchart that depicts process flow in the system of FIG. 5.

FIG. 7 shows a flowchart that describes process flow implemented by lock detector 500 to determine if the NCLK signal exhibits a frequency lock with respect to the REF_CLK signal. Lock detector 500 scans in the +N value, namely the FB_DIV_SET feedback divider setting, as per block 700. Lock detector 500 enters mode 1, namely a REF_CLK count up mode, as per block 705, to determine the expected NCLK value. More particularly, the MODE_SEL mode select signal selects the REF_CLK and +N signals as per block 710 and a REF_CLK window opens to begin count up of the REF_CLK signal pulses during mode 1, as per block 715. In one embodiment, for each leading clock edge of the REF_CLK signal during the REF_CLK window, detector 500 adds a count of +N to counter register 505, as per block 720. In another embodiment, lock detector 500 may count trailing edges of the REF_CLK signal pulses as opposed to counting the leading edges of those pulses. The REF_CLK window closes as per block 725. The count value now stored in register 505 when the REF_CLK window closes equals the expected NCLK value as per block 730. With closure of the REF_CLK window, the count up mode ceases.

Lock detector 500 then enters a mode 2, namely the actual NCLK count down mode as per block 735. An NCLK window opens, as per block 740, to begin the count down of the pulse count value stored in register 505. For each actual NCLK pulse that lock detector 500 encounters, detector 500 decrements the count value stored in counter register 505 by one as per block 745. The NCLK window closes to end the count down as per block 750. If the NCLK signal exhibits a lock with respect to the REF_CLK signal, then the final pulse count value stored in register 505 equals zero at the end of NCLK window.

Lock detector 500 then enters a mode 3, namely an offset mode, as per block 755. Lock detector 500 scans in an offset mask, namely an acceptable amount of frequency error measured in pulses, as per block 760. Lock detector conducts a test at decision block 765 to determine if the final pulse count value, i.e. the remaining NCLK value stored in register 505, is equal to or less than the offset value. If the remaining NCLK value in register 505 is equal to or less than the offset value, then detector 500 transitions the NCLK_LOCK signal high to indicate a frequency lock, as per block 770. However, if the remaining NCLK value in register 505 is not equal to or less than the offset value, then the NCLK_LOCK signal remains at a logic low to indicate the absence of frequency lock, as per block 775. After lock detector 500 determines lock at block 770 or absence of lock at block 775, process flow continues back to enter mode 1 block 705 and the process of testing for frequency lock begins again.

In the embodiment discussed above, each REF_CLK pulse receives a count value of N, for example 4, before the detector adds to the current count value stored in register 505. In other words, detector 500 effectively multiplies each REF_CLK pulse by N. In an equivalent embodiment, rather than multiplying each REF_CLK in the count up by N, detector 500 counts REF_CLK pulses and stores the number of counted pulses during the count up in register 505. In such an embodiment, detector 500 replaces every N NCLK pulses in the count down with a single count. In other words, instead of decrementing the count value in register 505 by one for each NCLK pulse encountered during the count down, lock detector decrements the count value in register 505 by 1 count for every N=4 NCLK pulses encountered by lock detector 500 in the count down mode of the NCLK window.

Figure 8:
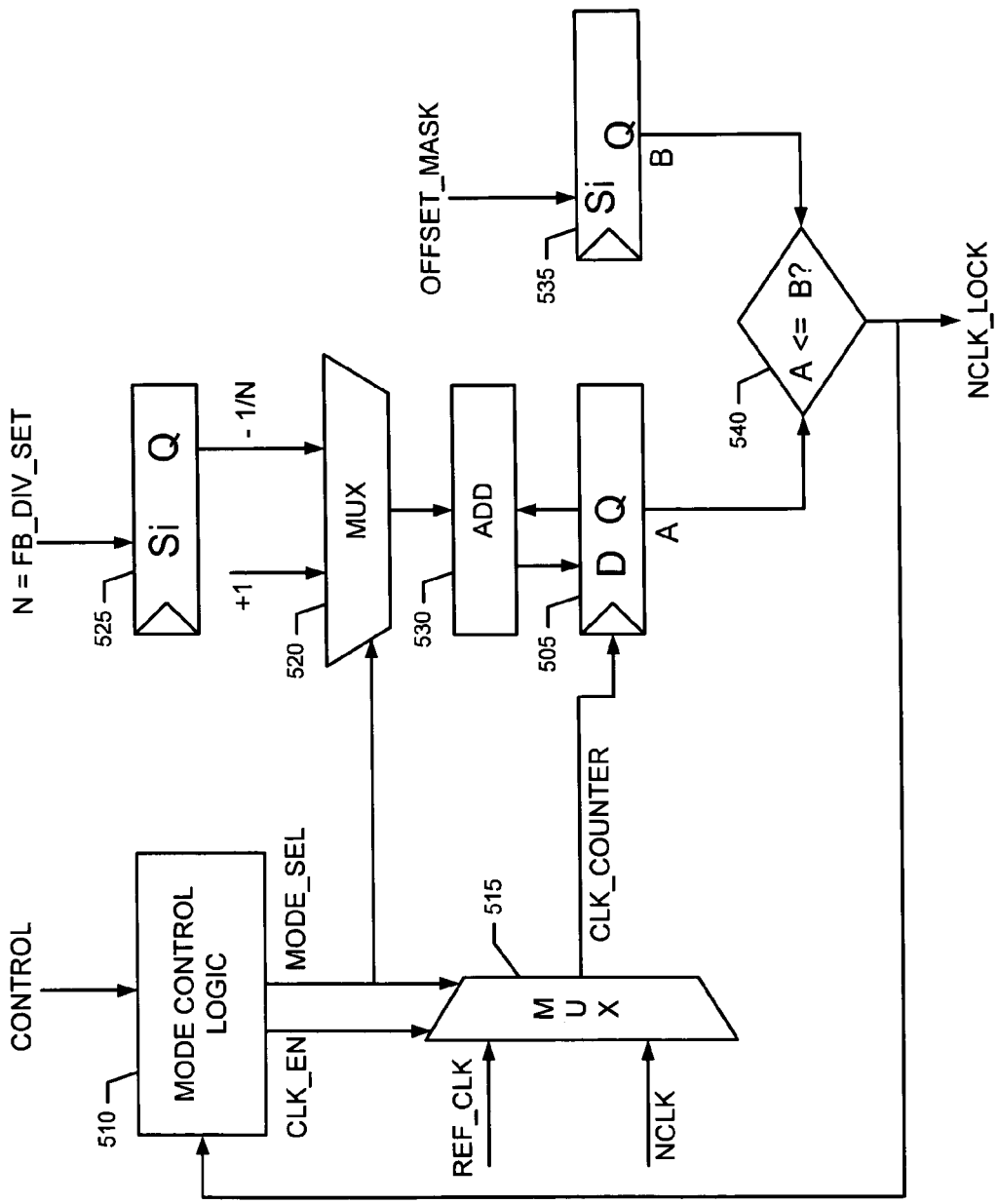
FIG. 8 shows an alternative embodiment of the system of FIG. 5.

FIG. 8 shows such a lock detector 800 wherein, during a count up mode in a REF_CLK window, the lock detector counts REF_CLK pulses and stores the number of REF_CLK pulses counted in register 505. Then, in a subsequent count down mode, the lock detector decrements the count value in register 505 by 1 count for every N NCLK pulse encountered by lock detector 500 in an NCLK window equal in duration to the REF_CLK window. Lock detector 800 of FIG. 8 is similar to lock detector 500 of FIG. 5 with like numbers indicating like elements. If the count value remaining in register 505 equals zero after the count down mode, then the NCLK signal exhibits a locked state with respect to the REF_CLK signal.

Some differences between lock detector 800 of FIG. 8 and lock detector 500 of FIG. 5 are now noted below. As seen in FIG. 8, lock detector 800 provides a +1 value to one input of MUX 520 and a −1/N value to the remaining input of MUX 520. Thus, MUX 520 provides a +1 value to adder 530 for each REF_CLK encountered by lock detector 800 during the REF_CLK window of the count up mode. However, during the count down mode, MUX 520 provides a −1/N value (e.g. −1/4 wherein N=4) to adder 530 for each NCLK pulse encountered by lock detector 800. In this manner, lock detector 800 effectively divides the total number of NCLK pulses occurring during the NCLK window of the count down mode by N. Thus, for every N NCLK pulses that lock detector 800 encounters during the count down mode, register 505 counts down by one.

Figure 9:
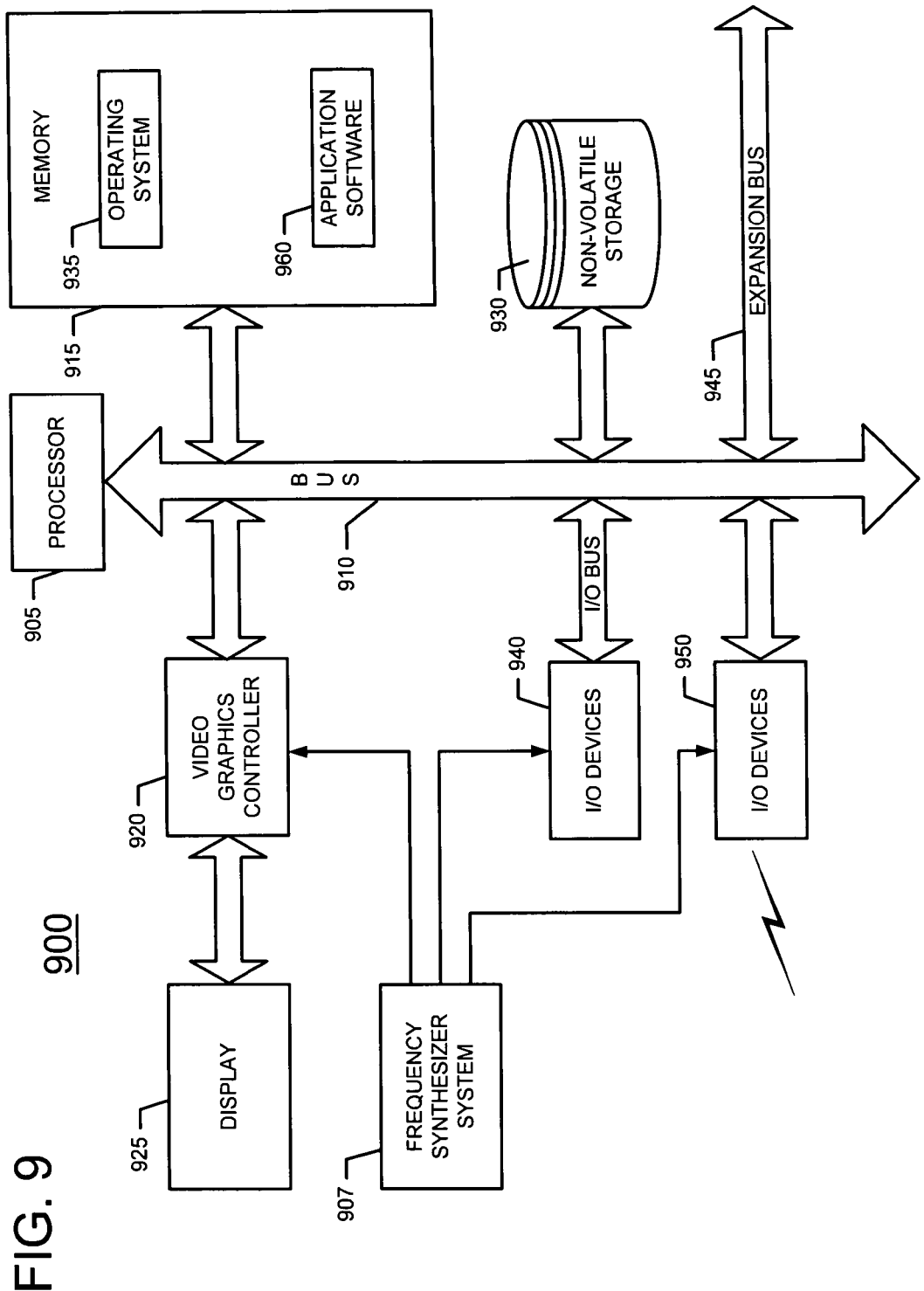
FIG. 9 shows an information handling system including the disclosed frequency synthesizer system.

FIG. 9 shows an information handling system (IHS) 900 that includes a processor 905. IHS 900 includes a frequency synthesizer system 907 that provides clocking signals to some of the components of IHS 900 as described below. IHS 900 further includes a bus 910 that couples processor 905 to system memory 915 and video graphics controller 920. A display 925 couples to video graphics controller 920. Non-volatile storage 930, such as a hard disk drive, CD drive, DVD drive, or other nonvolatile storage couples to bus 910 to provide IHS 900 with permanent storage of information. An operating system 935 loads in memory 915 to govern the operation of IHS 900. I/O devices 940, such as a keyboard and a mouse pointing device, couple to bus 910. One or more expansion busses 945, such as USB, IEEE 1394 bus, ATA, SATA, PCI, PCIE and other busses, may couple to bus 910 to facilitate the connection of peripherals and devices to IHS 900. A network adapter 950 couples to bus 910 to enable IHS 900 to connect by wire or wirelessly to a network and other information handling systems. While FIG. 9 shows one IHS that employs processor 900, the IHS may take many forms. For example, IHS 900 may take the form of a desktop, server, portable, laptop, notebook, or other form factor computer or data processing system. IHS 900 may also take other from factors such as a personal digital assistant (PDA), a gaming device, a portable telephone device, a communication device or other devices that include a processor and memory. In this particular embodiment, frequency synthesizer system 907 couples to one or more of video graphics controller 920, I/O devices 940 and I/O devices 950 to providing clocking signals thereto. Video graphics controller 920, I/O devices 940 and I/O devices 950 act as receptor circuits for these clocking signals. IHS 900 may employ frequency synthesizer system 200 of FIG. 2A as frequency synthesizer system 907. While FIG. 2A depicts distribution network or clock grid 210 as being internal to frequency synthesizer system 200, in IHS 900 a portion of the distribution network may be external to frequency synthesizer system 907. Frequency system 900 operates to assure that the clock signal reaching receptor circuits such as video graphics controller 920 and I/O devices 940, 950 exhibits a frequency lock with respect to a reference clock signal, REF_CLK, internal to frequency synthesizer system 907. Receptor circuits other than those discussed above in IHS 900 may also couple to frequency synthesizer system 200 depending upon the particular application. For example, other embodiments may employ processor 950 and memory 915 as receptor circuits.

The foregoing discloses a lock detection method and apparatus that, in one embodiment, maintains a frequency lock between downstream NCLK pulses and a REF_CLK signal. When downstream NCLK pulses exhibit a frequency lock with respect to the REF_CLK signal, the downstream NCLK pulses also exhibit a frequency lock with respect to a PLL_CLK output signal of the frequency synthesizer generating the PLL_CLK output signal.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is;

1. A frequency synthesizer lock detection system comprising:
   a reference clock that generates a reference clock signal;
   a frequency synthesizer including an input coupled to the reference clock and an output at which a synthesizer output signal is generated, the synthesizer output signal being locked in frequency to the reference clock signal;
   a distribution network, coupled to the synthesizer output, that distributes the synthesizer output signal as a downstream signal;
   a lock detector, coupled to the reference clock and the distribution network, that determines if the downstream signal is locked to the reference clock signal; and
   a receptor circuit coupled to the distribution network to receive the downstream signal therefrom, the receptor circuit comprising one of a microprocessor, a digital signal processor, a communication device and an information handling system;
   wherein the lock detector comprises:
   an observed pulse counter that determines an observed downstream count value by counting the number of pulses of the downstream signal that occur during a test window exhibiting a predetermined time duration;
   an expected pulse count unit that provides an expected downstream count value equal to the number of pulses of the downstream signal expected to occur during the test window; and
   a comparator, coupled to the observed pulse counter and the expected pulse count unit, that generates a lock signal to indicate that the downstream signal is locked to the reference clock signal when the observed downstream count value is approximately equal to the expected downstream count value.

2. The frequency synthesizer lock detection system of claim 1, wherein the observed pulse counter counts one of the rising and falling edges of each of the pulses of the downstream signal during the test window.

3. A frequency synthesizer lock detection system comprising:
   a reference clock that generates a reference clock signal;
   a frequency synthesizer including an input coupled to the reference clock and an output at which a synthesizer output signal is generated, the synthesizer output signal being locked in frequency to the reference clock signal;
   a distribution network, coupled to the synthesizer output, that distributes the synthesizer output signal as a downstream signal; and
   a lock detector, coupled to the reference clock and the distribution network, that determines if the downstream signal is locked to the reference clock signal,
   wherein the lock detector comprises:
   an observed pulse counter that determines an observed downstream count value by counting the number of pulses of the downstream signal that occur during a test window exhibiting a predetermined time duration; and
   an expected pulse count predictor and compare application, responsive to the observed pulse counter, the application determining an expected downstream count value equal to the number of pulses of the downstream signal expected to occur during the test window, the application comparing the observed downstream count value with the expected downstream count value to generate a lock signal to indicate that the downstream signal is locked to the reference clock signal when the observed downstream count value is approximately equal to the expected downstream count value.

4. A frequency synthesizer lock detection system comprising:
a reference clock that generates a reference clock signal;
a frequency synthesizer including an input coupled to the reference clock and an output at which a synthesizer output signal is generated, the synthesizer output signal being locked in frequency to the reference clock signal;
a distribution network, coupled to the synthesizer output, that distributes the synthesizer output signal as a downstream signal; and
a lock detector, coupled to the reference clock and the distribution network, that determines if the downstream signal is locked to the reference clock signal,
wherein the lock detector comprises:
a counter apparatus that operates in a first mode to count N pulses for each reference clock pulse encountered by the counter apparatus during a first test window to provide a total count value, wherein N is an integer the counter apparatus operating in a second mode to decrement the total count value by 1 for each pulse observed in the downstream signal during a second test window exhibiting the same predetermined time duration as the first test window, thus leaving a final count value in the counter apparatus, the counter apparatus generating a lock signal to indicate that the downstream signal is locked to the reference clock signal when the final count value is approximately equal to zero.

5. The frequency synthesizer lock detection system of claim 4, wherein the counter apparatus generates the lock signal to indicate that the downstream signal is locked to the reference clock signal when the final count value is less than or equal to a predetermined offset mask value.

6. A method of determining lock between signals, the method comprising:
supplying a reference clock signal to a frequency synthesizer that generates a synthesizer output signal locked in frequency to the reference clock signal;
distributing, by a distribution network, the synthesizer output signal as a downstream signal to a receptor circuit situated downstream of the frequency synthesizer; and
determining, by a lock detector coupled to the distribution network and the reference clock, if the downstream signal is locked to the reference clock signal;
wherein the determining step further comprises:
counting, by an observed pulse counter, the number of pulses of the downstream signal that occur during a test window exhibiting a predetermined time duration to determine an observed downstream count value;
providing an expected downstream count value equal to the number of pulses of the downstream signal expected to occur during the test window;
comparing, by a comparator, the observed downstream count value with the expected downstream count value to generate a lock signal that indicates that the downstream signal is locked to the reference clock signal when the observed downstream count value is approximately equal to the expected downstream count value.

7. The frequency synthesizer of claim 6, wherein the observed pulse counter counts one of the rising and falling edges of each of the pulses of the downstream signal during the test window.

8. A method of determining lock between signals, the method comprising:
supplying a reference clock signal to a frequency synthesizer that generates a synthesizer output signal locked in frequency to the reference clock signal;
distributing, by a distribution network, the synthesizer output signal as a downstream signal to a receptor circuit situated downstream of the frequency synthesizer; and
determining, by a lock detector coupled to the distribution network and the reference clock, if the downstream signal is locked to the reference clock signal;
wherein the determining step further comprises:
counting, by an observed pulse counter, the number of pulses of the downstream signal that occur during a test window exhibiting a predetermined time duration to determine an observed downstream count value; and
determining, by a count predictor and compare application, an expected downstream count value equal to the number of pulses of the downstream signal expected to occur during the test window, the count predictor and compare application comparing the observed downstream count value with the expected downstream count value to generate a lock signal to indicate that the downstream signal is locked to the reference clock signal when the observed downstream count value is approximately equal to the expected downstream count value.

9. A method of determining lock between signals, the method comprising:
supplying a reference clock signal to a frequency synthesizer that generates a synthesizer output signal locked in frequency to the reference clock signal;
distributing, by a distribution network, the synthesizer output signal as a downstream signal to a receptor circuit situated downstream of the frequency synthesizer; and
determining, by a lock detector coupled to the distribution network and the reference clock, if the downstream signal is locked to the reference clock signal;
wherein the determining step further comprises:
operating a counter apparatus in a first mode to count the number of reference clock pulses that occur during a first test window exhibiting a predetermined time duration, the counter apparatus counting N pulses for each reference clock pulse encountered by the counter apparatus to provide a total count value, wherein N is an integer;
operating the counter apparatus in a second mode to decrement the total count value by 1 for each pulse observed in the downstream signal during a second test window exhibiting the predetermined time duration, thus leaving a final count value in the counter apparatus; and
generating, by the lock detector, a lock signal to indicate that the downstream signal is locked to the reference clock signal when the final count value is approximately equal to zero.

10. The method of claim 9, wherein the generating step causes a lock signal to be generated to indicate that the downstream signal is locked to the reference clock signal when the final count value is less than or equal to a predetermined offset mask value.

11. An integrated circuit including a frequency synthesizer lock detector system, the integrated circuit comprising:
a reference clock that generates a reference clock signal;
a frequency synthesizer including an input coupled to the reference clock and an output at which a synthesizer output signal is generated, the synthesizer output signal being locked in frequency to the reference clock signal;

a distribution network, coupled to the synthesizer output, that distributes the synthesizer output signal as a downstream signal; and a lock detector, coupled to the reference clock and the distribution network, that determines if the downstream signal is locked to the reference clock signal, wherein the lock detector comprises:

an observed pulse counter that determines an observed downstream count value by counting the number of pulses of the downstream signal that occur during a test window exhibiting a predetermined time duration;

an expected pulse count unit that provides an expected downstream count value equal to the number of pulses of the downstream signal expected to occur during the test window; and a comparator, coupled to the observed pulse counter and the expected pulse count unit, that generates a lock signal to indicate that the downstream signal is locked to the reference clock signal when the observed downstream count value is approximately equal to the expected downstream count value.

12. An integrated circuit including a frequency synthesizer lock detector system, the integrated circuit comprising:

a reference clock that generates a reference clock signal;

a frequency synthesizer including an input coupled to the reference clock and an output at which a synthesizer output signal is generated, the synthesizer output signal being locked in frequency to the reference clock signal;

a distribution network, coupled to the synthesizer output, that distributes the synthesizer output signal as a downstream signal; and a lock detector, coupled to the reference clock and the distribution network, that determines if the downstream signal is locked to the reference clock signal, wherein the lock detector comprises:

an observed pulse counter that determines an observed downstream count value by counting the number of pulses of the downstream signal that occur during a test window exhibiting a predetermined time duration; and an expected pulse count predictor and compare application, responsive to the observed pulse counter, the application determining an expected downstream count value equal to the number of pulses of the downstream signal expected to occur during the test window, the application comparing the observed downstream count value with the expected downstream count value to generate a lock signal to indicate that the downstream signal is locked to the reference clock signal when the observed downstream count value is approximately equal to the expected downstream count value.

13. An integrated circuit including a frequency synthesizer lock detector system, the integrated circuit comprising:

a reference clock that generates a reference clock signal;

a frequency synthesizer including an input coupled to the reference clock and an output at which a synthesizer output signal is generated, the synthesizer output signal being locked in frequency to the reference clock signal;

a distribution network, coupled to the synthesizer output, that distributes the synthesizer output signal as a downstream signal; and a lock detector, coupled to the reference clock and the distribution network, that determines if the downstream signal is locked to the reference clock signal, wherein the lock detector comprises:

a counter apparatus that operates in a first mode to count N pulses for each reference clock pulse encountered by the counter apparatus during a first test window to provide a total count value, wherein N is an integer the counter apparatus operating in a second mode to decrement the total count value by 1 for each pulse observed in the downstream signal during a second test window exhibiting the same predetermined time duration as the first test window, thus leaving a final count value in the counter apparatus, the counter apparatus generating a lock signal to indicate that the downstream signal is locked to the reference clock signal when the final count value is approximately equal to zero.

14. The integrated circuit of claim 13, wherein the counter apparatus generates the lock signal to indicate that the downstream signal is locked to the reference clock signal when the final count value is less than or equal to a predetermined offset mask value.

* * * * *